(12) United States Patent
Goutzoulis (10) Patent No.: US 7,421,168 B1
(45) Date of Patent: Sep. 2, 2008

(54) INTEGRATED OPTICAL CHANNELIZER

(75) Inventor: Anastasios P. Goutzoulis, Annapolis, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 11/772,412

(22) Filed: Jul. 2, 2007

(51) Int. Cl.
*G02B 6/26* (2006.01)
*G02B 6/28* (2006.01)
*G02B 6/42* (2006.01)
*H04B 10/20* (2006.01)
*H04J 14/02* (2006.01)
*H01S 3/00* (2006.01)

(52) U.S. Cl. .................. 385/50; 385/16; 385/17; 385/24; 385/32; 398/59; 398/60; 398/82; 398/85; 359/337.2; 359/346

(58) Field of Classification Search .............. 385/50
See application file for complete search history.

(56) References Cited

U.S. PATENT DOCUMENTS

| | | | |
|---|---|---|---|
| 6,052,495 A | 4/2000 | Little et al. | |
| 6,195,187 B1 | 2/2001 | Soref et al. | |
| 6,512,866 B1 | 1/2003 | Fan et al. | |
| 6,611,645 B2 | 8/2003 | Aleksoff | |
| 6,643,421 B1 | 11/2003 | Chin et al. | |
| 6,876,796 B2 | 4/2005 | Garito et al. | |
| 6,901,224 B1 | 5/2005 | Davis | |
| 6,940,878 B2 | 9/2005 | Orenstein et al. | |
| 6,941,036 B2 | 9/2005 | Lucero | |
| 7,006,744 B2 | 2/2006 | Carniel et al. | |
| 7,065,276 B2 | 6/2006 | Scheuer et al. | |
| 7,110,632 B2 | 9/2006 | Abeles | |
| 7,120,333 B2 | 10/2006 | Eder et al. | |
| 7,123,800 B2 | 10/2006 | Kaplan | |
| 7,149,381 B2 | 12/2006 | Margalit et al. | |
| 7,174,064 B2 | 2/2007 | Sayyah et al. | |
| 2005/0123306 A1* | 6/2005 | Ilchenko et al. ............. 398/161 |
| 2006/0008272 A1 | 1/2006 | Abeles | |
| 2006/0159392 A1 | 7/2006 | Popovic | |
| 2006/0197959 A1 | 9/2006 | Barwicz et al. | |
| 2006/0228120 A9 | 10/2006 | McCallion et al. | |
| 2006/0245693 A1 | 11/2006 | Barwicz et al. | |

FOREIGN PATENT DOCUMENTS

WO 2005064375 A1 7/2005

* cited by examiner

*Primary Examiner*—Hemang Sanghavi
*Assistant Examiner*—Kajli Prince
(74) *Attorney, Agent, or Firm*—Marsteller & Associates, P.C.

(57) ABSTRACT

A signal channelizer (10) includes an input waveguide (14) carrying an inputted signal (20) having a plurality of wavelengths. The input waveguide (14) has an input port (22) for receiving the inputted signal (20). A plurality of ring resonators (12) for wavelength selection are arranged in parallel and coupled along the input waveguide (14) for receiving the inputted signal (20) from the input waveguide (14). The plurality of ring resonators (12) passes a selected wavelength signal to their respective output end (56). An output waveguide (16) passes a desired signal from one or more ring resonators (12). The output waveguide (16) is tapped with couplers (46) for providing a desired signal to feed the output end (56). A detector (32) associated with the output end (56) of each ring resonators (12) produces the desired RF output signal (34) representative of the desired RF band.

18 Claims, 8 Drawing Sheets

BW (3dB)=1.5GHz

FIG. 12

BW (3dB)=1.4GHz
BW (20dB)=2.0GHz
BW (40dB)=2.7GHz

INTEGRATED OPTICAL CHANNELIZER

BACKGROUND OF THE INVENTION

1. Technical Field

The invention relates to the field of RF channelizers using RF photonic modulators and filters, and more particularly to switches and filters that use closed loop resonators.

2. Background Art

RF channelizers cover wide instantaneous bandwidths (BWs) (2-18 GHz, for example), and enable systems to passively detect, classify, and locate targets from their RF emissions. State-of the-art channelizers are based on RF filter banks which are implemented via various filtering techniques, e.g., thin-film, micro-machined, discrete elements etc. In all cases typical channelized receivers occupy areas of more than 10 square inches. As such, they cannot fill system needs where truly miniature volume is a must, such as multibeam wideband ESAs which cover multi-octaves and enable receive operations for many users, platforms and missions. Examples of such RF channelizers are U.S. Pat. Nos. 6,052, 495, 6,195,187, and others.

The present Integrated Optical Channelizer (IOC) is based on extremely small, very-high Q (which is the figure of merit of a resonant circuit), integrated optical micro ring resonators.

Further, the present Integrated Optical Channelizer (IOC) approach has the unique aspect of combining on a single chip: (1) optical up-conversion, (2) extremely small, very-high Q, integrated optical micro ring resonators and (3) optical down-conversion to achieve RF channelization over a wide RF band. As will be shown, the present IOC approach does not require new "physics" or even new fabrication techniques.

While the above cited references introduce and disclose a number of noteworthy advances and technological improvements within the art, none completely fulfills the specific objectives achieved by this invention.

DISCLOSURE OF INVENTION

In accordance with the present invention, a photonic RF signal channelizer includes an input waveguide that carries an inputted wideband RF signal as modulation on a center optical wavelength (or carrier). Within the input waveguide the RF modulation appears as a plurality of wavelengths around the center optical wavelength. The input waveguide has an input port for receiving the inputted signal. A plurality of ring resonators for wavelength selection are arranged in parallel and coupled along the input waveguide for receiving the inputted signal from the input waveguide. Each of the ring resonators pass a selected optical wavelength signal to an output waveguide. Each ring resonator has its own output waveguide. Each output waveguide is injected with a portion of the raw (unmodulated) center optical wavelength which is carried by another waveguide. A detector associated with the output end of the output waveguide from each ring resonator produces the desired output filtered RF signal. The result is that the ring resonators provide desired optical wavelength filtering of the inputted signal and the detector, after mixing with the center optical wavelength, provides the channelized RF output.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

Mode(s) for Carrying Out the Invention

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

In summary, a signal channelizer 10 includes an input waveguide 14 that carries an inputted signal 20 having a plurality of wavelengths that includes at least one the desired center optical wavelength. The input waveguide 14 is connected to an Integrated Optical Modulator (IOM) 42 which has an input port 22 for receiving an unmodulated carrier wave (CW) optical signal 40 and an input RF port 60 for receiving the wideband RF signal 58 to be channelized. After modulation of the CW optical signal, the wideband RF signal appears as a plurality of optical wavelengths 20. A plurality of ring resonators 12 for wavelength selection are arranged in parallel and coupled along the input waveguide 14 for receiving the inputted signal 20 from the input waveguide 14.

The plurality of ring resonators 12 passes a selected wavelength signal to their respective output end 56. An output or control waveguide 16 carries the unmodulated CW optical carrier which has been stripped from all modulated after passing through a very narrow optical ring resonator filter $12_x$. The output waveguide 16 passes or communicates a desired portion of the CW optical signal to the output of each ring resonator 12. The output waveguide 16 is tapped with couplers 46 for providing the desired portion of the CW optical carrier to feed the output end 56 of the ring resonators 12 with the desired CW optical carrier. An optical detector 32 associated with the output end 56 of each ring resonator 12 produces the desired output RF filtered for channelized) signal 34. The result is that the ring resonators 12 provide desired wavelength filtering of the inputted signal 20 and after mixing with the optical carrier the detector or detectors 32 provides the channelizing of the output signal 34 into desired RF components.

The present Integrated Optical Channelizer (IOC) 10 is based on known photonic micro-ring resonators (MRRs) 12, thus the operation of MRRs may be briefly summarized as follows. Photonic MRRs 12 are versatile wavelength-selective devices that can be used to synthesize a wide range of photonic filtering functions.

Figure 1:
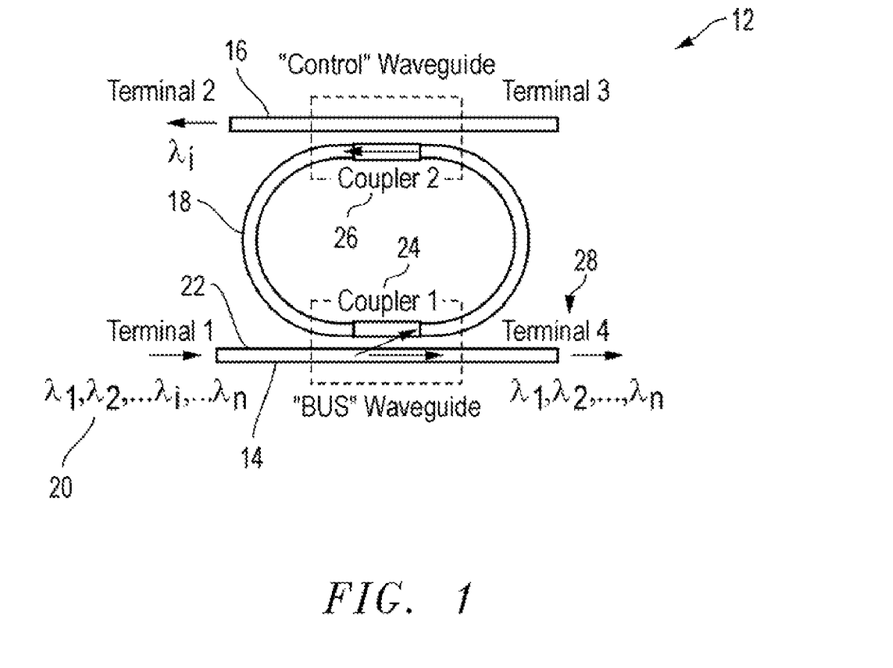
FIG. 1 is a schematic illustration of a known micro-ring resonator (MRR).

As shown in FIG. 1, an MRR 12 consists of two parallel optical waveguides 14, 16 with a ring waveguide 18 in between them. In an MRR 12, multiple optical wavelength signals 20 enter at the input port 22 of the "bus" waveguide 14. Of those wavelengths one will be coupled into the ring 18 via Coupler 1 24. Next, the optical signal in the ring 18 will be coupled into the "control" waveguide 16 via Coupler 2 26.

The degree to which coupling is achieved depends on the resonant condition: $n_{eff}L=m\lambda$, where: $n_{eff}$ is the effective refractive index of the bending waveguide. L is the circumference of the ring 18, $\lambda$ is the optical wavelength and m is an integer. When optical wavelength $\lambda_i$ satisfies the above condition, it will be coupled 100% from the bus waveguide 14 to the control waveguide 16, while all other wavelengths that do not satisfy the above condition will continue into the bus waveguide 14 with virtually zero attenuation and exit at output terminal 28.

Figure 2:
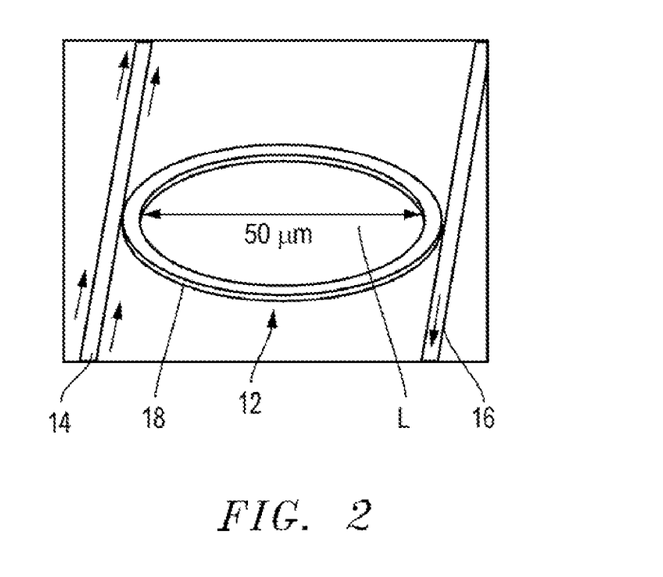
FIG. 2 is a depiction of a known MRR.

This filtering operation is also explained in FIG. 2 (note the extremely small dimension of the ring, of the order of 50 microns). This small size manifests the fact that the size of a filter SCALES with the carrier wavelength; optical components are ORDERS of magnitude smaller than their RF equivalents.

Figure 3:
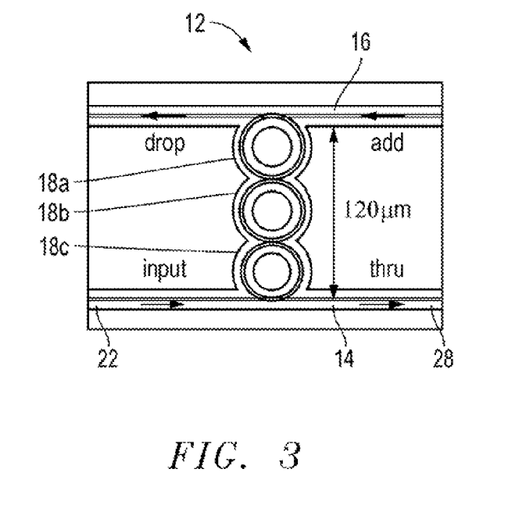
FIG. 3 is a depiction of a MRR having 3 rings.
Figure 4:
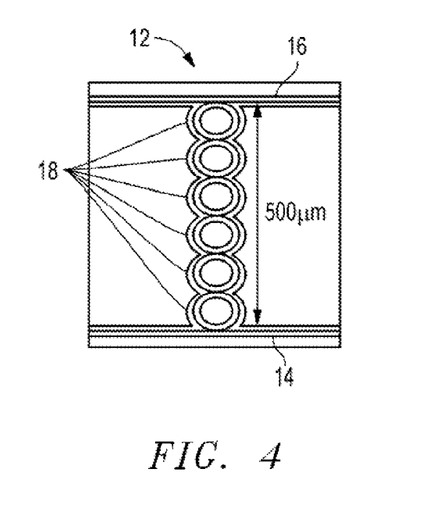
FIG. 4 is a depiction of a MRR having 6 rings.

To increase the "finess" or coupling selectivity of the ring, two or more rings 18a-18c can be used, as shown in FIGS. 3-4.

Figure 5:
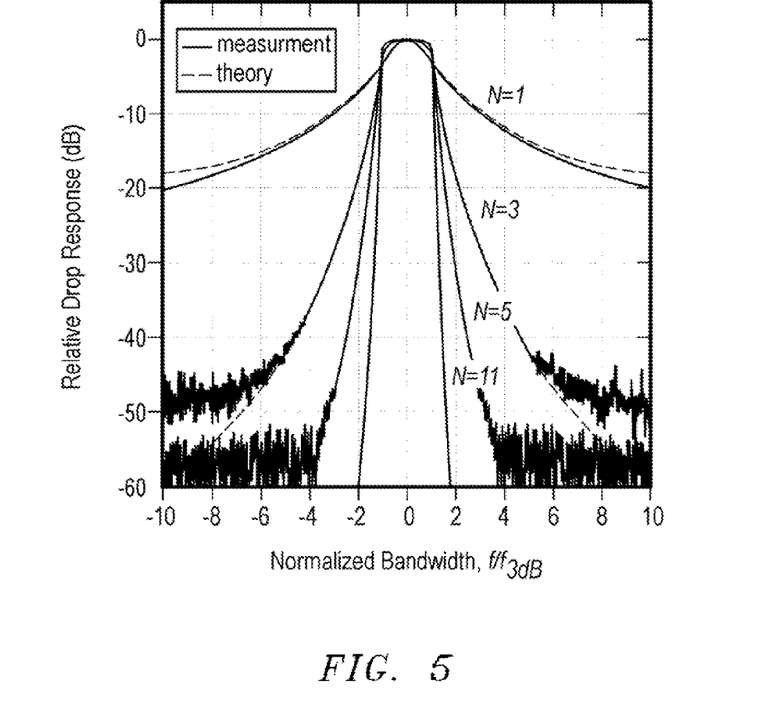
FIG. 5 is a graph or plot of filter selectivity versus the number of rings.

FIG. 5 depicts that the filter selectivity increases as the number of rings 18 increases. Again, note the extremely small dimensions involved. MRRs 12 can be made in various substrates using conventional optoelectronic foundries, e.g., $SiO_2$ (Silicon Dioxide), InP (Indium Phosphides), and various forms of glass-like materials such as HYDEX by Infinera. These MRRs were made almost exclusively for TELECOM-oriented applications, such as MUX/DEMUX, add/drop filters, dispersion compensators, etc. Such devices have been made as small as a few μm in size and are thus ideal for large scale integration.

Because the present invention also uses on-chip down conversion, the relationships between RF modulated optical carriers are photonic filters should also be briefly described.

Figures 6, 6A:
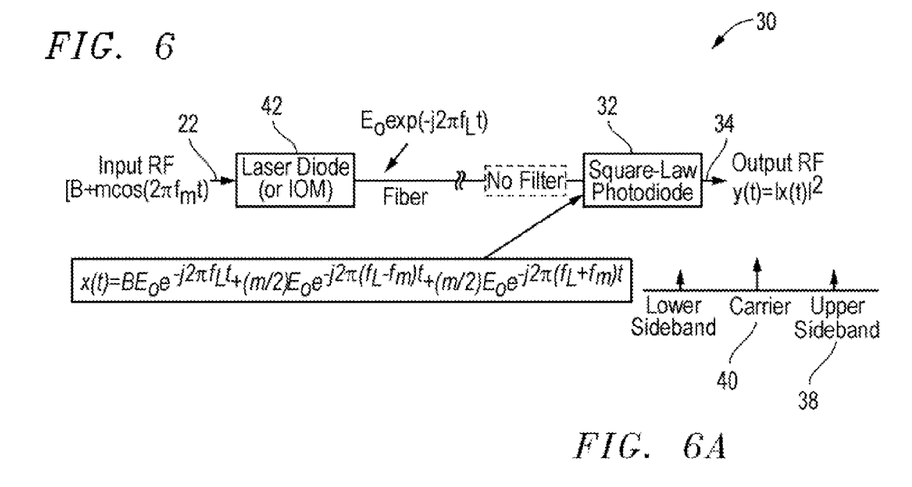
FIG. 6 is a schematic illustration of a RF modulated link without optical filtering.
FIG. 6a is a graphical representation of the frequencies passed in the RF modulated link of FIG. 6.

FIG. 6 shows a self-explanatory classic model of an RF modulated link 30 that employs a square law detector 32. As Equation Set 1 below shows, the detector's output 34, y(t), consists of the linear term of interest, a bias term, and a second harmonic term that is generated from the square-law process.

$$y(t) = x(t)*x(t) = [BE_o e^{-j2\pi f_1 t} + (m/2)E_o e^{-j2\pi(f_1-f_m)t} +$$
$$(m/2)E_o e^{-j2\pi(f_1+f_m)t}] *$$
$$[BE_o e^{+j2\pi f_2 t} + (m/2)E_o e^{+j2\pi(f_2-f_m)t} +$$
$$(m/2)E_o e^{+j2\pi(f_2+f_m)t}] = \ldots$$
$$= E_o^2\left(B^2 + \frac{m^2}{2}\right) + 2E_o^2 mB\cos(2\pi f_m t) + E_o^2 \frac{m^2}{2}\cos(2\pi 2f_m t)$$
$$= \text{(Bias term)} + \text{(Linear term)} + \text{(Second harmonic)}$$

Figures 7, 7A:
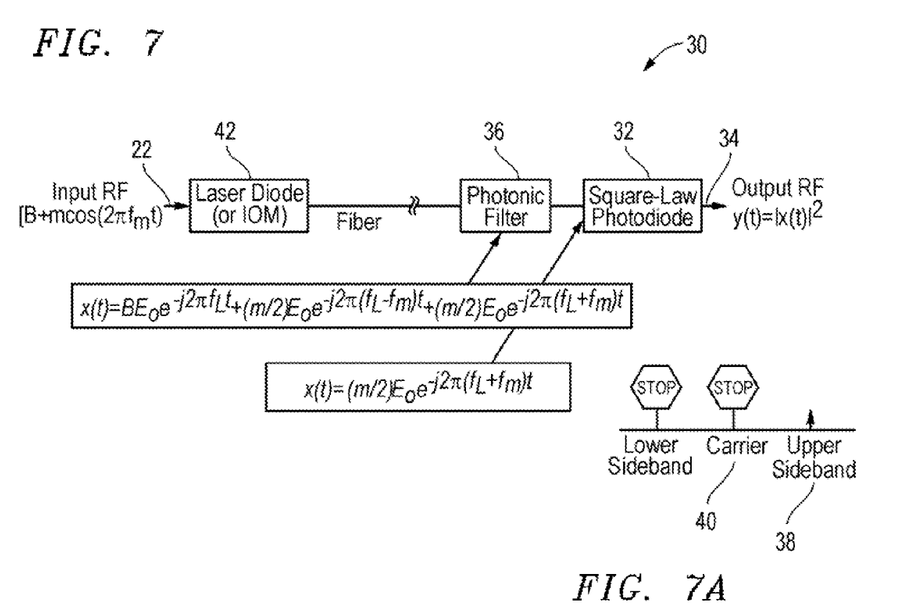
FIG. 7 is a schematic illustration of a RF modulated link with "WDM" type optical filtering (only upper sideband passes).
FIG. 7a is a graphical representation of the frequencies passed in the RF modulated link of FIG. 7.

Equation Set 1. Mathematical Representation of the Unfiltered Square Law Detector Output FIG. 7 shows what happens when a typical photonic filter 36 connected inline and ahead of the detector 32 is used to pass only a "specific" wavelength or band of light, e.g., the upper sideband of the modulated optical carrier such as the one shown in FIG. 7a. An example of such a filter can be an MRR 12 used for TELECOM applications with the square law detector 32 reading the output of the "control" waveguide 16. In this case the detector's output y(t) does not contain any term proportional to the input RF signal, i.e., all RF information is lost.

Figures 8, 8A:
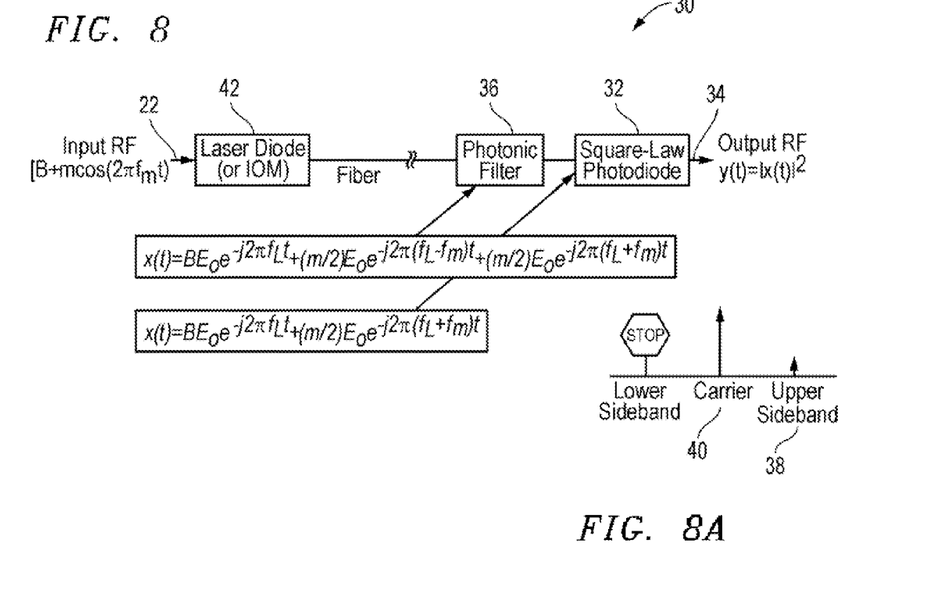
FIG. 8 is a schematic illustration of a RF modulated link with "composite" optical filtering (upper sideband and carrier pass).
FIG. 8a is a graphical representation of the frequencies passed in the RF modulated link of FIG. 8.

This situation is corrected by using a composite photonic filter 36 connected inline and ahead of the detector 32 that passes not only the wavelength of interest 38 (i.e., upper sideband), but also the carrier 40. In other words, to recover the RF information, we need to use a composite photonic filter 36 that passes, not only the wavelength or band of interest 38 (e.g., the upper sideband of the previous example), but also the optical carrier 40. This case is shown in FIG. 8a.

The mathematical representation of the output of the square law detector 32 for the composite filter case (see FIG. 8) is given in Equation Set 2, and shows that the output 34 contains the linear term of interest, without any second harmonic products. Note that the linear term is 3 dB below the non-filtered approach (FIG. 6).

$$y(t) = x(t)*x(t) = [BE_o e^{-j2\pi f_1 t} + (m/2)E_o e^{-j2\pi(f_1+f_x)t}] *$$
$$[BE_o e^{+j2\pi f_2 t} + (m/2)E_o e^{+j2\pi(f_2+f_x)t}] = \ldots$$
$$= E_o^2\left(B^2 + \frac{m^2}{2}\right) + E_o^2 mB\cos(2\pi f_m t)$$
$$= \text{(Bias term)} + \text{(Linear term)}$$

Equation Set 2. Mathematics of the Composite-filtered Square Law Detector Output Also it should be noted that the term "composite filtering" (as shown in FIG. 8 and Equation Set 2) indicates that in order to perform RF filtering via photonic means, one must perform the photonic RF filtering, but one must also mix the result with the photonic carrier prior to square law detection.

The present Integrated Optical Channelizer (IOC) 10 combines: (1) photonic up-conversion, (2) combined on-chip photonic MMR filtering and photonic down-conversion, and (3) on-chip square law detection to create a very powerful RF channelizer. Further, the IOC 10 of the present invention employs 3 key operations: (1) up-conversion of the RF band of interest by modulating an optical carrier with the received RF signal, (2) multi-channel filtering in the optical domain (via multiple MRRs) with GHz-type resolution, and (3) down-conversion of the filtered MRR outputs via mixing with the optical carrier and subsequent square-law detection.

Figure 9:
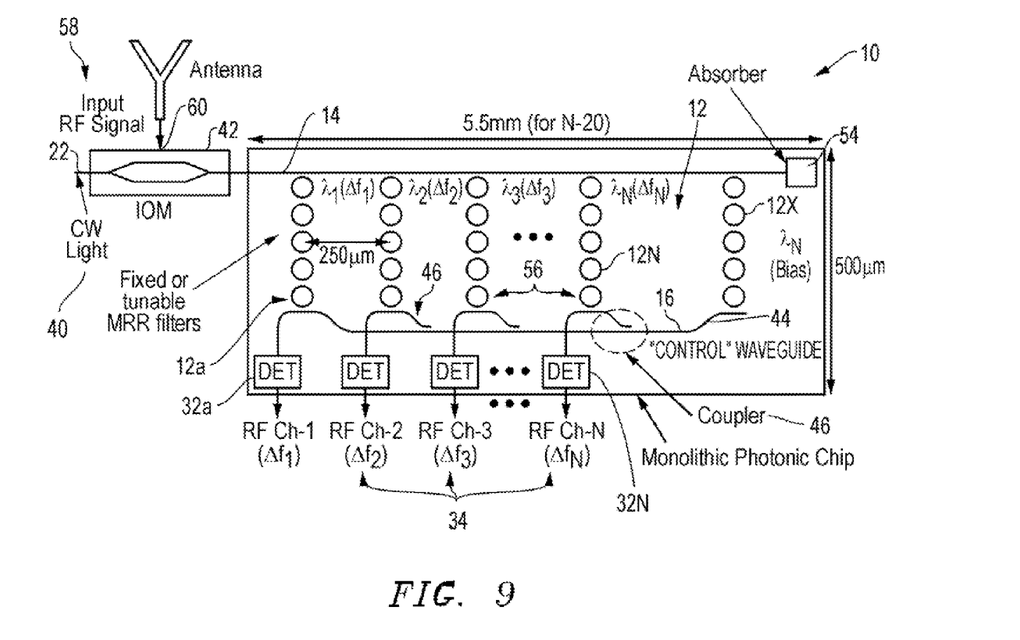
FIG. 9 is a schematic illustration of the integrated optical channelizer (IOC) architecture of the present invention.

FIG. 9 shows how the above 3 key operations are combined to create the IOC 9 single-chip architecture. With the aid of FIG. 9 one can understand the present IOC 10 via its 3 key operations as follows.

Operation-1. Optical up-conversion: The input RF signal 58 to be channelized modulates an optical carrier 40 using an external Integrated Optical Modulator 42 (or IOM). As we will see later, an on-chip heterogeneously-integrated IOM 42 is also possible.

Operation-2. Photonic filtering: The RF-modulated optical carrier 40 enters the "bus" waveguide 14 of an integrated optical structure 10. As it propagates it encounters N different multi-order MRRs $12_A$-$12_N$ that are designed to "sharply" band-pass-filter a narrow band of light ($\Delta f_i$) over the full RF modulation $F_{full}$ and are connected in a parallel arrangement along the bus waveguide 14. The center frequency ($f_c$) of these filters increases by $\Delta f$, and such that $N \times \Delta f = F_{full}$. For example, to cover the 2-18 GHz band with 20 MRR filters each with $\Delta f = 0.8$ GHz, the MRR-to-MRR $f_c$ must increase by 0.8 GHz.

Operation-3. Carrier mixing and detection: In FIG. 9, the last MRR filter $12_X$ before the terminus 54 of the bus or input waveguide 14 deals exclusively with the optical carrier or "bias" wavelength $\lambda_c$; specifically, it separates it from any other unfiltered signals and guides it into the control waveguide 16. The control waveguide 16 of FIG. 9 acts as a "bias" bus 44 that one "taps" with coupler 46 in order to feed the output from the output end 56 of each MRR filter $12_A$-$12_N$; the objective being to mix the filtered sideband with the carrier 40, as shown in FIGS. 8 and equation Set 2.

This "feeding" is accomplished using on-chip variable ratio optical couplers 46. The "variable" ratio is needed in order to feed the output of each MRR $12_A$-$12_N$ with approximately the same amount of "carrier" optical power. Thus, as the control waveguide 16 goes from right to left (FIG. 9) the ratio of each coupler 46 increases because less and less light is available. (Note that the same operation could be achieved by "equally" splitting the control waveguide output into N channels, and then direct each channel to a different MRR. Unfortunately, the 1-to-N splitter approach increases the complexity and size of the IOC.) The N-output waveguides which carry both the N-channels of the filtered modulation and N-equal power carrier portions end up in an on-chip integrated square law detector $32_A$-$32_N$ ("DET" in FIG. 9). The detectors can be either heterogeneously integrated onto the chip or they can be grown/deposited directly onto the chip.

As FIG. 9 shows, the dimensions of the IOC 10 are extremely small. Since typical resonators, made in Si or HYDEX, are separated by about 250 microns and are about 50 microns in diameter, a 20 channel 5th order MRR IOC will occupy ~5.5 mm×0.5 mm (again, this is due to the fact that the size of a filter SCALES with the carrier wavelength). Thus, the IOC 10 of FIG. 9 could accomplish what COTS RF channelizers accomplish in more than 10 square inches.

Figure 10:
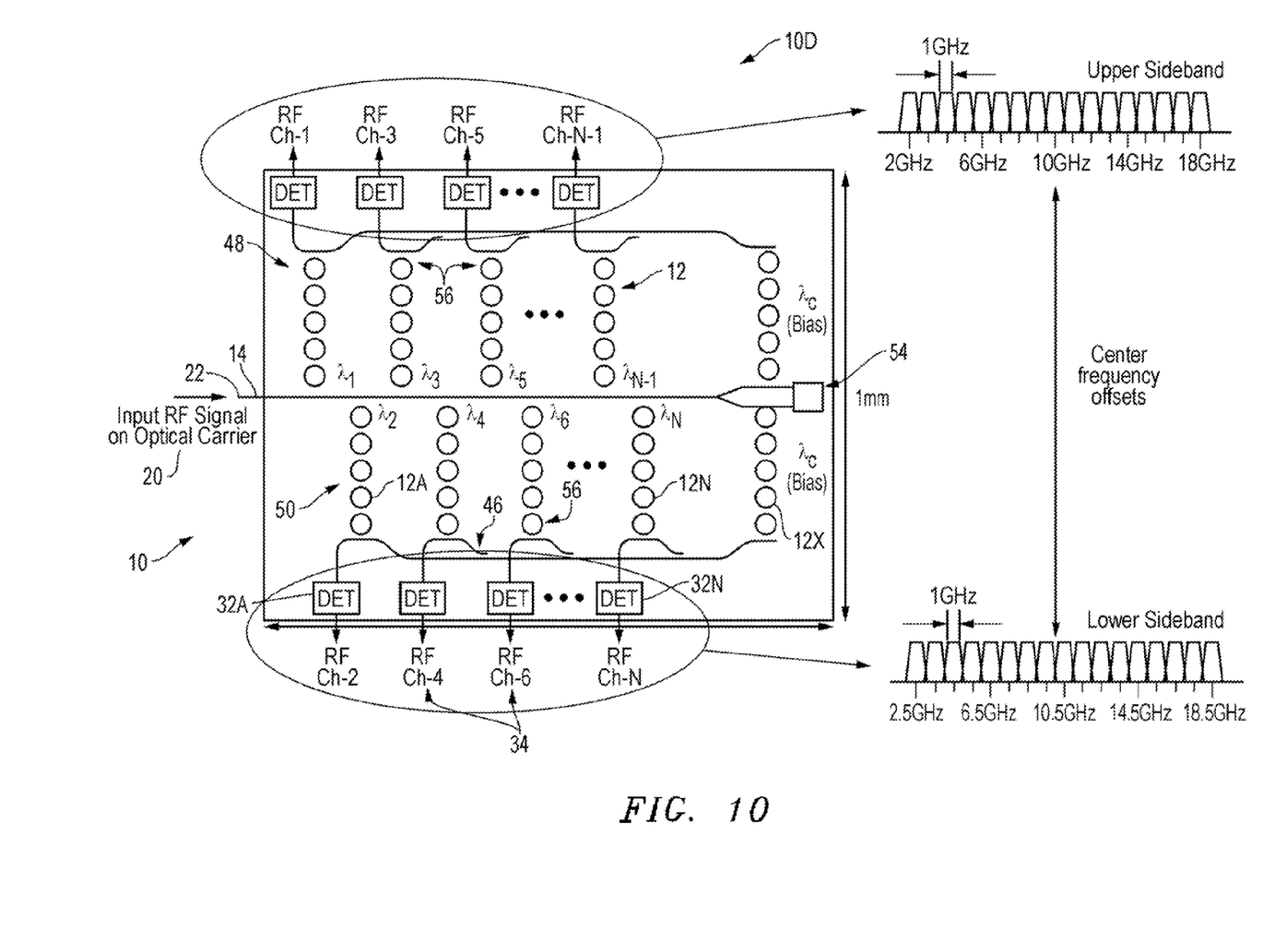
FIG. 10 is a schematic illustration of the IOC with utilization of both upper and lower sidebands.

FIG. 10 shows a variant of the IOC 10 of FIG. 9 which uses not only the upper sideband and carrier, but also the lower sideband and carrier to implement two layers 48, 50 of "shoulder-to-shoulder" filter bands. Here the objective is two-fold: (1) one relaxes the neighboring filter overlap requirements, and (2) one covers the full RF band without blind spots or reduced gain areas. Note that the description of the "dual sideband" IOC $10_D$ is similar to the single sideband one 10; one must emphasize however, that in each filter: (1) only a single sideband is mixed with the carrier 40, and (2) we can mix and match filter bandwidths (BWs) and $f_c$.

Figure 11:
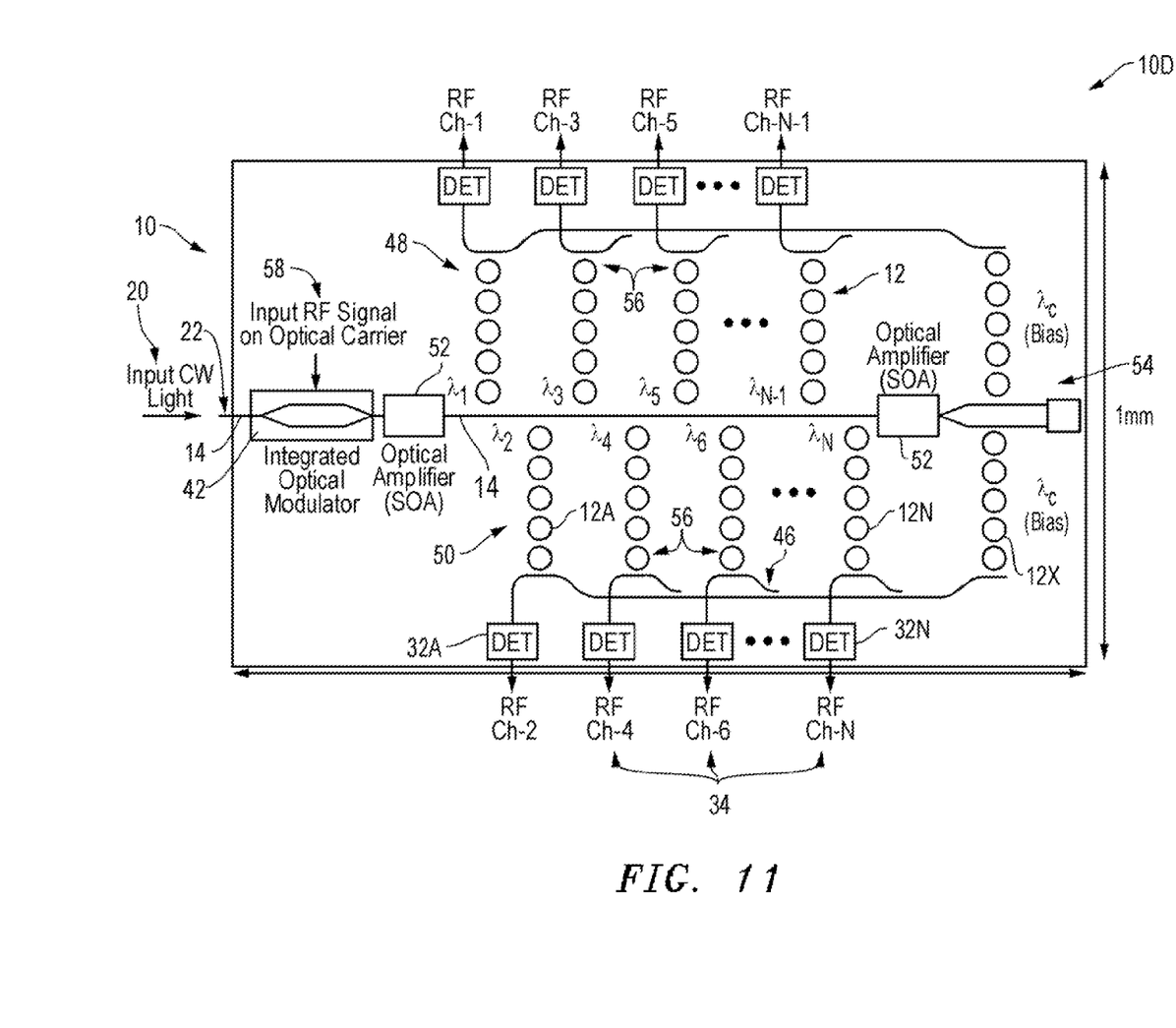
FIG. 11 is a schematic illustration of IOC architecture with heterogeneously-integrated Integrated Optical Modulators (IOMs) and Semiconductor Optical Amplifiers (SOAs).

By combining micro-scale level optical filters with: (1) miniaturized Si-based ($SiO_2$) wideband Integrated Optical Modulators (IOM) 42 and (2) Semiconductor Optical Amplifiers (SOA) 52 to amplify an optical component of the input signal 20, one can achieve extremely flexible IOC designs. For example, a 20 GHz RF SOI IOM 42 fabricated by others has dimensions of the order of 1 mm×0.1 mm, whereas typical InP-based SOAs 52 have dimensions of 100s $\mu m^2$. Such devices can be heterogeneously added to the IOC substrate which may be Si, Glass-type, HYDEX, InP, etc. In this case one can realize fully functional IOCs with integrated IOMs and SOAs as shown in FIG. 11, where the gain blocks can be distributed as deemed necessary. Note that the overall dimensions for this IOC 10 are still extremely small, 7 mm×1 mm, for 40 RF output channels.

Figure 12:
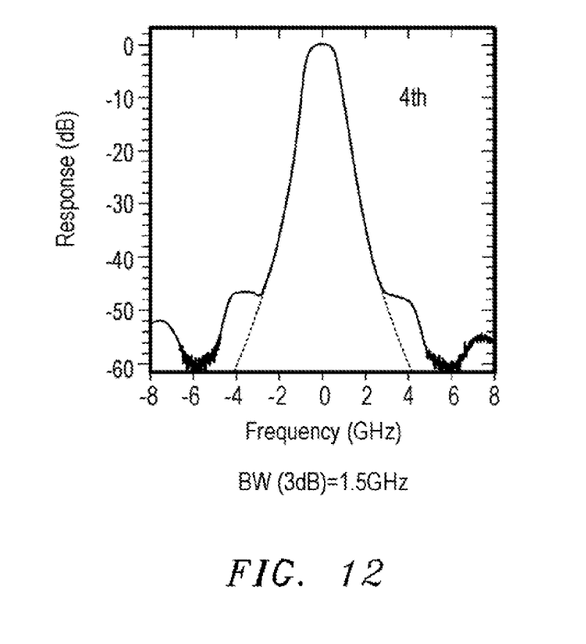
FIGS. 12 to 14 are a series of graphs or plots of known sharp, narrow band filters.
Figure 13:
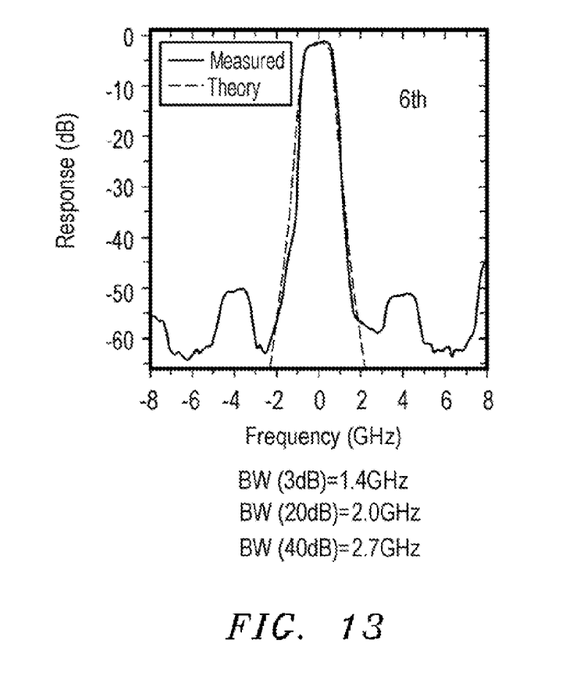
Figure 14:
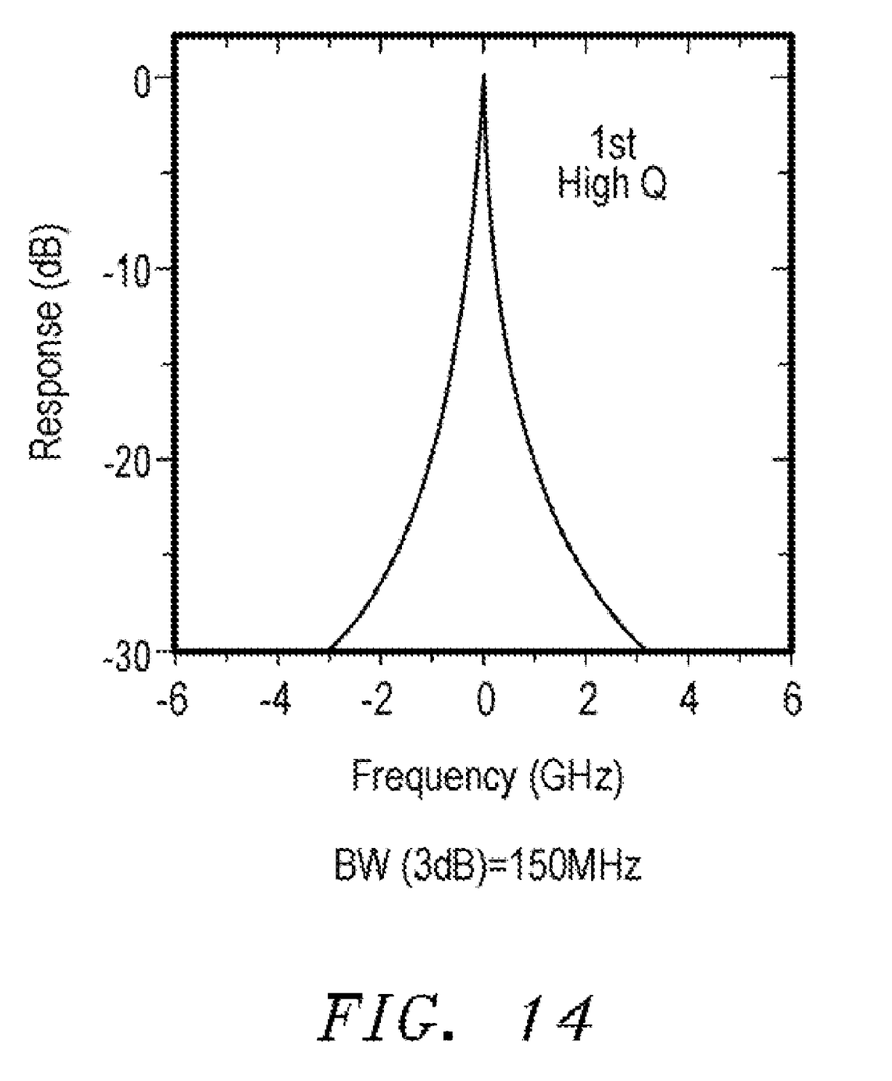

Finally, the Qs required by the MRR IOC 10 filters are very high; however, they can be satisfied with existing photonic technology. For example, the loaded Q for a 1 GHz filter around 1550 nm (193.4 THz) is about 193,000. FIGS. 12-14 show examples of very sharp, narrow band filters demonstrated on the HYDEX substrate of Infinera Corp. Similar results have been shown for MRRs 12 made in Si.

In summary, the present invention of a truly miniaturized IOC architecture is based on photonic micro-ring resonators 12, the outputs of which are properly mixed, in situ, with the optical carrier. The IOC 10 is very flexible in terms of number of channels, center frequencies and bandwidths, and it can be made in various existing material platforms.

The foregoing disclosure and description of the invention are illustrative and explanatory thereof, and various changes in the size, shape and materials, as well as in the details of the illustrated construction may be made without departing from the spirit of the invention.

The invention claimed is:

1. A signal channelizer comprising:
    an input waveguide that carries an inputted signal having a plurality of wavelengths including at least one desired wavelength; the input waveguide having an input port;
    a plurality of ring resonators for wavelength selection arranged in parallel and coupled along the input waveguide for receiving the inputted signal, the plurality of ring resonators passing a selected wavelength signal to an output end;
    an output waveguide;
    the output waveguide being tapped with couplers for providing a desired unmodulated carrier wave (CW) to feed the output end of the ring resonators with the desired signal; and,
    a detector associated with the output end of corresponding ring resonators for producing the desired channelized RF output signal representative of the desired RF band;
    whereby the ring resonators provide desired wavelength filtering of the inputted signal and the detectors in conjunction with optical mixing provide the channelizing of the output signal into desired RF components.

2. The invention of claim 1 wherein the ring resonators have a plurality of rings.

3. The invention of claim 1 wherein the ring resonators are formed as micro ring resonators.

4. The invention of claim 1 wherein one of the plurality of ring resonators coupled along the input waveguide acts as a bias ring resonator to select a carrier signal from the inputted signal providing the desired signal feeding the output end of the ring resonators.

5. The invention of claim 1 wherein a plurality of detectors are associated with respective ring resonators.

6. The invention of claim 1 further including an optical modulator for modulating an inputted optical carrier signal with a received signal creating the inputted signal for the input waveguide.

7. The invention of claim 1 wherein the signal channelizer further comprises a single chip architecture.

8. The invention of claim 1 further uses the upper sideband and carrier along with the lower sideband and carrier by having two layers of shoulder-to-shoulder arranged filter banks.

9. The invention of claim 1 wherein the input waveguide further includes an optical amplifier means for amplifying an optical signal component if the input signal.

10. A method for channelizing an input RF signal into desired RF component output signals comprising the steps of:

introducing an inputted RF signal as modulation around an optical carrier wave (CW) signal into an input waveguide; the resulting optical signal having a plurality of wavelengths including the CW optical signal; the input waveguide having an input port;

filtering the inputted signal through a plurality of ring resonators for wavelength selection; the plurality of ring resonators arranged in parallel and coupled along the input waveguide for receiving the inputted signal; the plurality of ring resonators passing a selected wavelength signal to an output end;

communicating an output signal to an output waveguide; the output waveguide being tapped with couplers for providing a portion of the optical CW signal to feed the output end of the ring resonators with a portion of the optical CW signal; and, producing a desired RF output signal representative of the desired RF band with a detector associated with the output end of the ring resonators.

11. The method of claim 10 wherein the ring resonators have a plurality of rings.

12. The method of claim 10 wherein the ring resonators are formed as micro ring resonators.

13. The method of claim 10 wherein one of the plurality of ring resonators coupled along the input waveguide acts as a bias ring resonator to select a carrier signal from the inputted signal providing the desired signal feeding the output end of the ring resonators.

14. The method of claim 10 wherein a plurality of detectors are associated with respective ring resonators.

15. The method of claim 10 further including an output modulator for modulating an inputted optical carrier signal with a received signal creating the inputted signal for the input waveguide.

16. The method of claim 10 wherein the signal channelizer further comprises a single chip architecture.

17. The method of claim 10 further uses the upper sideband and carrier along with the lower sideband and carrier by having two layers of shoulder-to-shoulder arranged filter banks.

18. The method of claim 10 wherein the input waveguide further includes an optical amplifier means for amplifying an optical signal component if the input signal.

* * * * *